(12) United States Patent
Okaguchi

(10) Patent No.: US 11,280,329 B2
(45) Date of Patent: Mar. 22, 2022

(54) DRIVING DEVICE AND FLUID CONTROL DEVICE

(71) Applicant: Murata Manufacturing Co., Ltd., Kyoto (JP)

(72) Inventor: Kenjiro Okaguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 126 days.

(21) Appl. No.: 16/940,793

(22) Filed: Jul. 28, 2020

(65) Prior Publication Data

US 2020/0355178 A1 Nov. 12, 2020

Related U.S. Application Data

(63) Continuation of application No. PCT/JP2019/002664, filed on Jan. 28, 2019.

(30) Foreign Application Priority Data

Jan. 30, 2018 (JP) .............................. JP2018-013462

(51) Int. Cl.
*F04B 43/04* (2006.01)
*H01L 41/04* (2006.01)
*F04B 49/06* (2006.01)
*F04B 45/047* (2006.01)

(52) U.S. Cl.
CPC ............ *F04B 43/04* (2013.01); *F04B 45/047* (2013.01); *F04B 49/06* (2013.01); *H01L 41/042* (2013.01)

(58) Field of Classification Search
CPC ........ F04B 43/04; F04B 45/047; F04B 49/06; H01L 41/042
See application file for complete search history.

(56) References Cited

U.S. PATENT DOCUMENTS 4,973,876 A * 11/1990 Roberts ................. B06B 1/0253
310/316.01
6,617,754 B1 9/2003 Knauss
(Continued)

FOREIGN PATENT DOCUMENTS

JP 2004056914 A 2/2004
JP 2005210769 A 8/2005
(Continued)

OTHER PUBLICATIONS

International Search Report issued in Application No. PCT/JP2019/002664, dated Apr. 23, 2019.
(Continued)

*Primary Examiner* — Patrick Hamo
(74) *Attorney, Agent, or Firm* — Pearne & Gordon LLP

(57) ABSTRACT

A driving device includes a voltage regulation circuit, a driving signal generation circuit, a current limiting circuit, and a voltage control circuit. The voltage regulation circuit regulates a power supply voltage and outputs a driving voltage. The driving signal generation circuit generates a driving signal to a piezoelectric element of a piezoelectric pump by using the driving voltage. The current limiting circuit limits a driving current corresponding to the driving voltage to a specified current or less, and generates a current control voltage. The voltage control circuit limits the driving voltage based on the current control voltage.

9 Claims, 9 Drawing Sheets

(56) References Cited

U.S. PATENT DOCUMENTS

| | | | |
|---|---|---|---|
| 6,819,027 B2 * | 11/2004 | Saraf | B06B 1/0261 |
| | | | 310/316.01 |
| 7,675,218 B2 * | 3/2010 | Kawaguchi | G04C 3/12 |
| | | | 310/317 |
| 8,258,886 B2 * | 9/2012 | Gilbert | A61B 17/320092 |
| | | | 331/154 |
| 8,659,921 B2 * | 2/2014 | Buchwald | H02M 3/33507 |
| | | | 363/75 |
| 2005/0225202 A1 | 10/2005 | Vogeley et al. | |
| 2007/0242427 A1 | 10/2007 | Yamamoto et al. | |
| 2017/0194880 A1 | 7/2017 | Liao et al. | |
| 2017/0365768 A1 * | 12/2017 | Okaguchi | B06B 1/0207 |

FOREIGN PATENT DOCUMENTS

| | | |
|---|---|---|
| JP | 2007129804 A | 5/2007 |
| JP | 2017131098 A | 7/2017 |
| WO | 2016/183084 A1 | 11/2016 |

OTHER PUBLICATIONS

Written Opinion issued in Application No. PCT/JP2019/002664, dated Apr. 23, 2019.

* cited by examiner

DRIVING DEVICE AND FLUID CONTROL DEVICE

This is a continuation of International Application No. PCT/JP2019/002664 filed on Jan. 28, 2019 which claims priority from Japanese Patent Application No. 2018-013462 filed on Jan. 30, 2018. The contents of these applications are incorporated herein by reference in their entireties.

BACKGROUND

Technical Field

The present disclosure relates to a driving device which drives a piezoelectric element.

Currently, various devices using a piezoelectric element, such as a piezoelectric pump, have been put into practical use.

Patent Document 1 describes a driving device for a piezoelectric element. The driving device described in Patent Document 1 includes a driving circuit unit and a current limiting circuit unit. The current limiting circuit unit prevents overcurrent flowing through the piezoelectric element.

Patent Document 1: Japanese Unexamined Patent Application Publication No. 2004-56914

BRIEF SUMMARY

However, in the driving device indicated in Patent Document 1, when the amount of current to be supplied is limited, power corresponding to the limited amount of current is consumed in the current limiting circuit unit. Thus, unnecessary power is consumed in the driving device.

The present disclosure realizes an efficient driving device while limiting current to a piezoelectric element.

A driving device according to the present disclosure is a driving device that controls driving of a piezoelectric element. The driving device includes a voltage regulation circuit, a driving signal generation circuit, a current limiting circuit, and a voltage control circuit.

The voltage regulation circuit outputs a driving voltage. The driving signal generation circuit receives the driving voltage outputted from the voltage regulation circuit, and generates a driving signal to the piezoelectric element using the driving voltage. The current regulation circuit receives a driving current corresponding to the driving voltage outputted from the driving signal generation circuit, limits the driving current to a specified current or less, and generates a current control voltage. The voltage control circuit receives the current limiting voltage outputted from the current limiting circuit, and outputs a control signal for controlling the driving voltage to the voltage regulation circuit based on the current control voltage.

With this configuration, the voltage control circuit controls the driving voltage, thereby suppressing an increase in power even when the current is limited.

Further, the driving device according to the present disclosure can have the following configuration. The driving device further includes a temperature detector. The temperature detector detects a temperature of the piezoelectric element and generates a temperature regulation voltage. The voltage control circuit outputs a control signal for controlling the driving voltage based on the current control voltage and the temperature regulation voltage.

With this configuration, the driving voltage and current are controlled based on the temperature of the piezoelectric pump, so that a rise of temperature in the piezoelectric pump is suppressed.

Further, the driving device according to the present disclosure can have the following configuration. The voltage regulation circuit, the driving signal generation circuit, the current limiting circuit, and the voltage control circuit are mounted on a circuit board.

With this configuration, the driving device can be reduced in size and can be manufactured at low cost.

In addition, in the driving device according to the disclosure, the temperature detector can include a mountable temperature sensor element. Further, the temperature sensor element is mounted on a circuit board.

With this configuration, the temperature of the piezoelectric pump including the piezoelectric element is indirectly detected.

In addition, in the driving device according to the present disclosure, the temperature sensor element can be disposed close to the current limiting circuit.

With this configuration, the temperature of the piezoelectric pump is accurately detected.

In addition, in the driving device according to the present disclosure, for example, the driving signal generation circuit may be a self-excited analog circuit.

With this configuration, the driving circuit for the piezoelectric pump is configured without necessarily using a digital IC or the like.

In addition, in the driving device according to the present disclosure, the voltage control circuit can be constituted by a resistor element connected to the driving signal generation circuit.

With this configuration, the voltage control circuit can be realized with a simple configuration, and unnecessary oscillation of the self-excited driving signal generation circuit is suppressed.

Further, the driving device according to the present disclosure may have, for example, the following configuration. The voltage control circuit is a digital circuit that uses an output of the current limiting circuit.

With this configuration, a voltage of the driving signal generation circuit is limited by digital processing.

In addition, a fluid control device according to the present disclosure includes any one of the above-described driving devices and a piezoelectric pump including a piezoelectric element.

With this configuration, an efficient fluid control device is realized.

According to the present disclosure, it is possible to improve driving efficiency for the piezoelectric element while limiting the current to the piezoelectric element.

DETAILED DESCRIPTION

Figure 1:
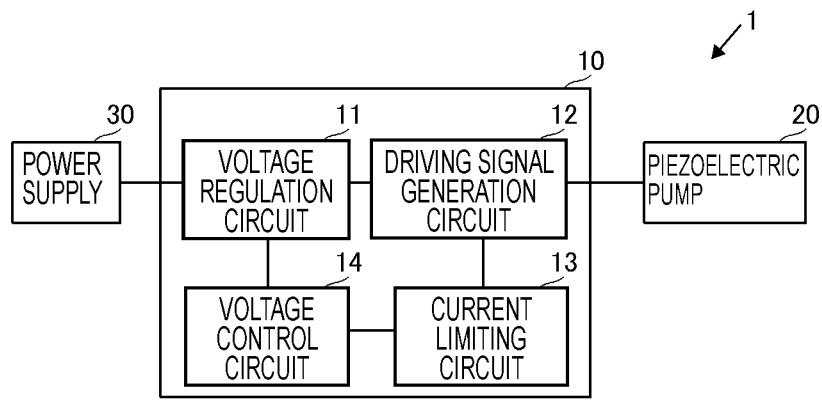
FIG. 1 is a functional block diagram of a fluid control device 1 including a driving device 10 according to Embodiment 1 of the present disclosure.

A driving device according to Embodiment 1 of the present disclosure will be described with reference to the drawings. FIG. 1 is a functional block diagram of a fluid control device 1 including a driving device 10 according to Embodiment 1 of the present disclosure.

As illustrated in FIG. 1, the fluid control device 1 includes the driving device 10, a piezoelectric pump 20, and a power supply 30. The fluid control device 1 is employed in application devices, such as a breast pump, a negative pressure wound therapy (NPWT) device, a nasal aspirator, a blood pressure monitor. The fluid control device 1 can be applied to any device that utilizes a fluid, such as air sucked and discharged by the piezoelectric pump 20, in addition to these devices.

The driving device 10 and the power supply 30 are electrically connected to each other, and the driving device 10 and the piezoelectric pump 20 are electrically connected to each other. The power supply 30 is, for example, a battery.

Note that in the following description, "electrical connection" between a plurality of functional units will be simply referred to as "connection".

The driving device 10 generates a driving signal of a specified voltage and a specified current for driving the piezoelectric pump 20 using a voltage from the power supply 30, and outputs the driving signal to the piezoelectric pump 20. The piezoelectric pump 20 includes a piezoelectric element, and realizes operations of sucking and discharging fluid by driving the piezoelectric element according to the driving signal.

The driving device 10 includes a voltage regulation circuit 11, a driving signal generation circuit 12, a current limiting circuit 13, and a voltage control circuit 14.

The voltage regulation circuit 11 is connected to the power supply 30, the driving signal generation circuit 12, and the voltage control circuit 14. The driving signal generation circuit 12 is connected to the voltage regulation circuit 11 and the current limiting circuit 13, and is connected to the piezoelectric pump 20. The current limiting circuit 13 is connected to the driving signal generation circuit 12 and the voltage control circuit 14. The voltage control circuit 14 is connected to the current limiting circuit 13 and the voltage regulation circuit 11.

The voltage regulation circuit 11 is a so-called step-up circuit, step-down circuit, or step-up/down circuit. The voltage regulation circuit 11 regulates a voltage received from the power supply 30 and outputs a regulated voltage to the driving signal generation circuit 12. The regulated voltage corresponds to a "driving voltage" of the present disclosure. Note that an input or output of the voltage regulation circuit 11 may be a direct current or an alternating current.

The driving signal generation circuit 12 is realized by, for example, a self-excited or a separately-excited analog circuit. The driving signal generation circuit 12 generates a driving signal (control signal) of a driving frequency based on a resonance frequency of the piezoelectric pump 20 at a specified voltage and a specified current using the regulated voltage, and outputs the driving signal to the piezoelectric pump 20.

The current limiting circuit 13 is, for example, an analog circuit using a plurality of transistors. The current limiting circuit 13 limits a current of the driving signal generation circuit 12. The current limiting circuit 13 outputs a voltage corresponding to the limited current to the voltage control circuit 14. Note that the current flowing from the driving signal generation circuit 12 to the current limiting circuit 13 corresponds to a "driving current" of the present disclosure.

The voltage control circuit 14 is constituted by, for example, a resistor element connected between the current limiting circuit 13 and a circuit section that determines a regulation voltage in the voltage regulation circuit 11. The voltage control circuit 14 outputs a control voltage for limitation to the voltage regulation circuit 11 using the output voltage of the current limiting circuit 13. The control voltage for limitation is a voltage for controlling the output voltage of the voltage regulation circuit 11 so that the regulated voltage (the output voltage of the voltage regulation circuit 11) does not reach a specified upper limit voltage. Note that the output voltage of the current limiting circuit 13 corresponds to a "current control voltage" of the present disclosure.

With such a configuration, the driving signal outputted from the driving device 10 becomes a signal in which the current and the voltage are limited. Therefore, the driving device 10 can suppress supply of an overcurrent and an overvoltage to the piezoelectric pump 20. Thereby, the driving efficiency of the piezoelectric pump 20 is improved. Further, breakage of the piezoelectric pump 20 is suppressed, and reliability of the piezoelectric pump 20 and the fluid control device 1 is improved.

Figure 2A:
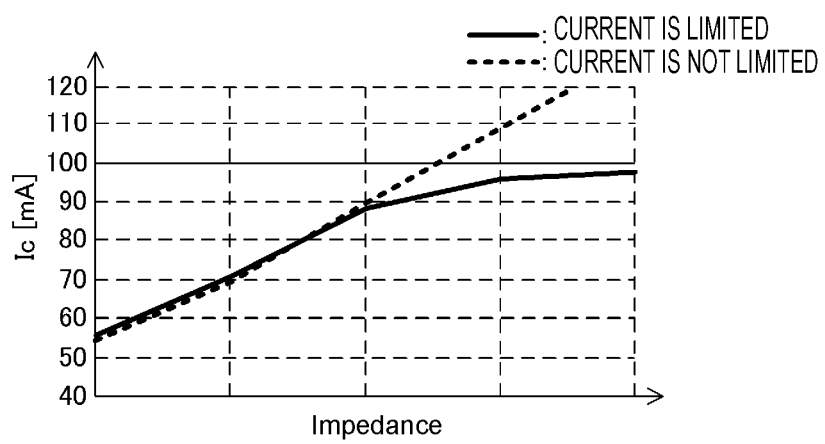
FIG. 2A is a graph showing the relationship between the current and the resistance to the piezoelectric pump when the current is limited and when the current is not limited.
Figure 2B:
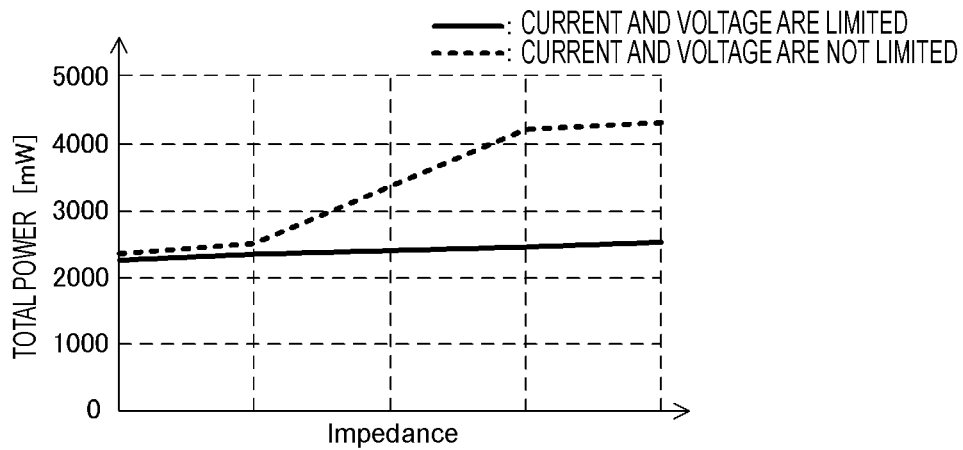
FIG. 2B is a graph showing a total power of the fluid control device 1 when the current and the voltage are limited (in the configuration of the present application) and when the current and the voltage are not limited (in the comparative configuration).

FIG. 2A is a graph showing the relationship between the current and the resistance to the piezoelectric pump 20 when the current is limited and when the current is not limited. In FIG. 2A, the vertical axis represents the current supplied to the piezoelectric pump 20, and the horizontal axis represents the impedance of the piezoelectric pump. FIG. 2B is a graph showing the total power of the fluid control device 1 when the current and the voltage are limited (in the configuration of the present application) and when the current and the voltage are not limited (in the comparative configuration). In FIG. 2B, the vertical axis represents the total amount of power supplied to the fluid control device, and the horizontal axis represents the impedance of the piezoelectric pump.

Figure 3A:
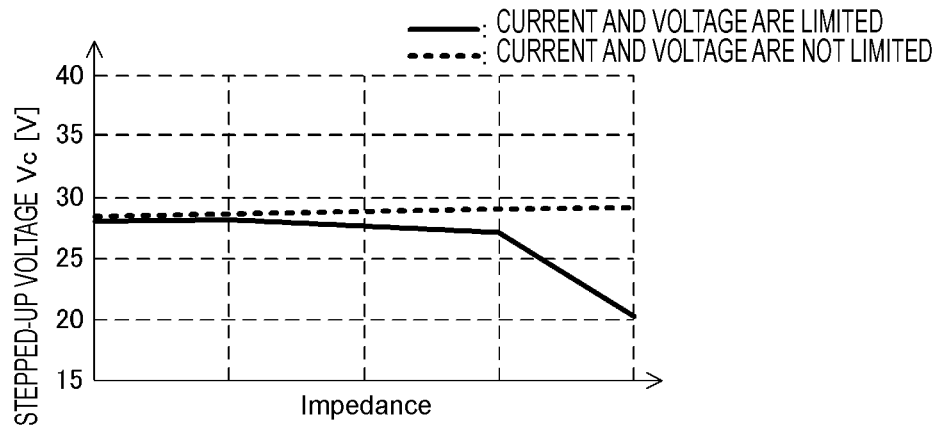
FIG. 3A is a graph showing the output voltage of the driving signal generation circuit when the current and the voltage are limited (in the configuration of the present application) and when the current and the voltage are not limited (in the comparative configuration)
Figure 3B:
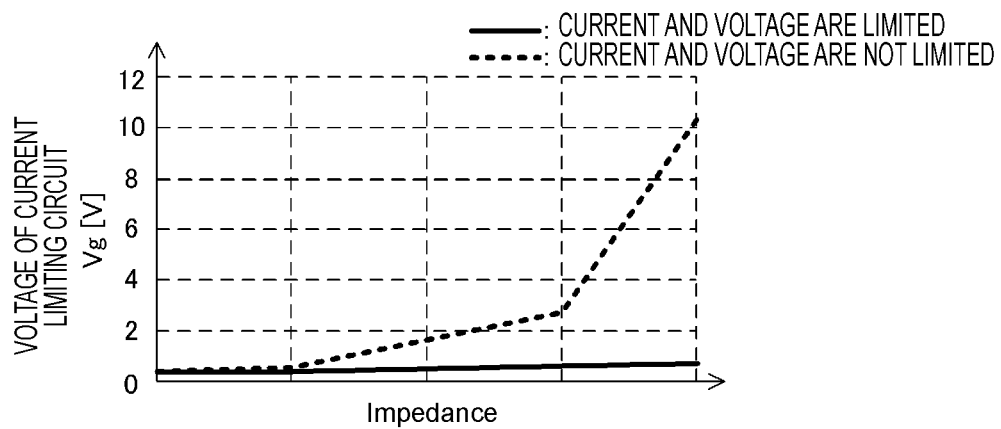
FIG. 3B is a graph showing the voltage of the current limiting circuit 13 when the current and the voltage are limited (in the configuration of the present application) and when the current and the voltage are not limited (in the comparative configuration)
Figure 3C:
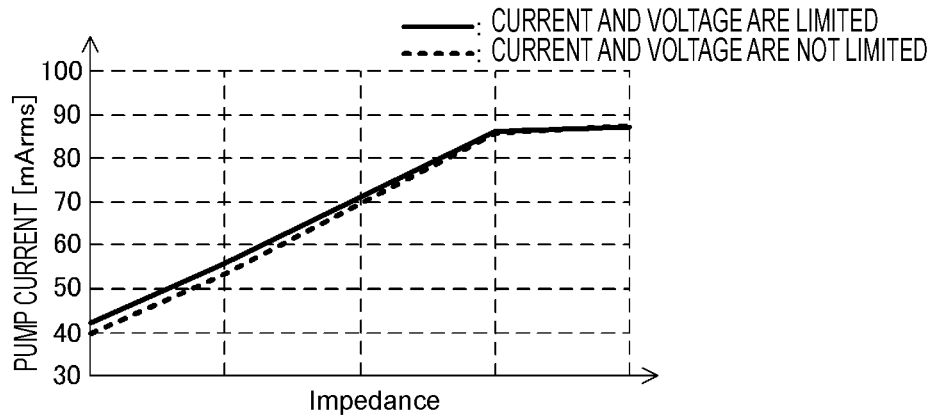
FIG. 3C is a graph showing the pump current when the current and the voltage are limited (in the configuration of the present application) and when the current and the voltage are not limited (in the comparative configuration).

FIG. 3A is a graph showing the output voltage of the driving signal generation circuit 12 when the current and the voltage are limited (in the configuration of the present application) and when the current and the voltage are not limited (in the comparative configuration). FIG. 3B is a graph showing the voltage of the current limiting circuit when the current and the voltage are limited (in the configuration of the present application) and when the current and the voltage are not limited (in the comparative configuration). FIG. 3C is a graph showing the pump current when the current and the voltage are limited (in the configuration of the present application) and when the current and the voltage are not limited (in the comparative configuration). In FIG. 3A, the vertical axis represents the output voltage of the voltage regulation circuit 11 (stepped-up voltage: regulated voltage), and the horizontal axis represents the impedance of the piezoelectric pump. In FIG. 3B, the vertical axis represents the voltage of the current limiting circuit 13, and the horizontal axis represents the impedance of the piezoelectric pump. In FIG. 3C, the vertical axis represents the current supplied to the piezoelectric pump 20, and the horizontal axis represents the impedance of the piezoelectric pump 20.

By including the current limiting circuit 13 in the driving device 10, as shown in FIG. 2A, the current supplied to the piezoelectric pump 20 can be limited so as not to reach a specified upper limit value (100 [mA] in a case of FIG. 2A). The upper limit value is set according to the driving specifications of the piezoelectric pump 20 and the piezoelectric element, and is set by an upper limit of a current value at which the piezoelectric pump 20 and the piezoelectric element continue to operate normally as a pump. Accordingly, an overcurrent to the piezoelectric pump 20 is limited.

Further, by including the voltage control circuit 14 in the driving device 10, as shown in FIG. 3A, a voltage supplied to the driving signal generation circuit 12 is suppressed as the current increases. This is because, when a current flowing through the driving signal generation circuit 12 exceeds the above-described upper limit, an overcurrent flows into the current limiting circuit 13, and a voltage of the current limiting circuit 13 increases as illustrated in FIG. 3B. The increase in voltage is outputted to the voltage control circuit 14, and the voltage control circuit 14 supplies a control voltage for limitation corresponding to the increase in voltage to the voltage regulation circuit 11. The voltage regulation circuit 11 reduces an output voltage (regulated voltage) according to the limitation voltage for control. Thereby, the voltage supplied to the driving signal generation circuit 12 is suppressed.

As a result, as shown in FIG. 2B, the total power of the fluid control device 1 can be suppressed by limiting the current and the voltage supplied to the piezoelectric pump 20 at the upper limit value.

On the other hand, as shown in FIG. 3C, since the current supplied to the piezoelectric pump 20 is maintained, the output of the piezoelectric pump 20 is maintained.

Figure 4:
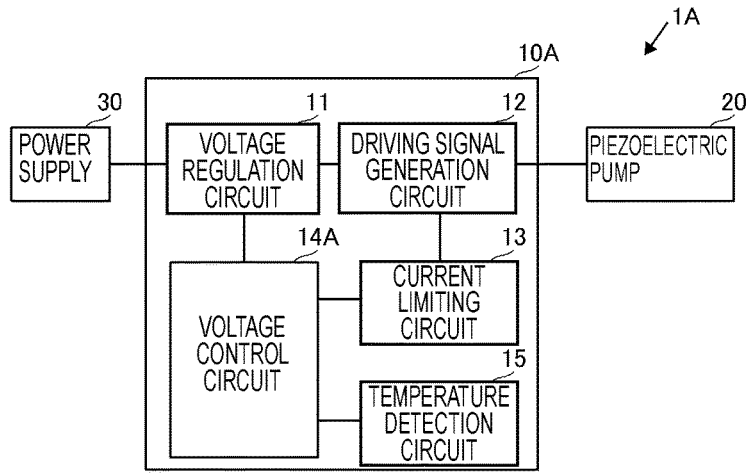
FIG. 4 is a functional block diagram of a fluid control device 1A including a driving device 10A according to Embodiment 2 of the present disclosure.

Next, a driving device according to Embodiment 2 will be described with reference to the drawings. FIG. 4 is a functional block diagram of a fluid control device 1A including a driving device 10A according to Embodiment 2 of the present disclosure.

As illustrated in FIG. 4, the driving device 10A according to Embodiment 2 is different from the driving device 10 according to Embodiment 1 in that a voltage control circuit 14A and a temperature detection circuit 15 are included. The other configurations of the driving device 10A is the same as those of the driving device 10, and a description of the same portions will be omitted.

As illustrated in FIG. 4, the fluid control device 1A includes the driving device 10A, the piezoelectric pump 20, and the power supply 30. The fluid control device 1A is different from the fluid control device 1 according to Embodiment 1 in that the driving device 10A is included, and other basic configurations are the same as those of the fluid control device 1.

The driving device 10A includes the voltage regulation circuit 11, the driving signal generation circuit 12, the current limiting circuit 13, a voltage control circuit 14A, and a temperature detection circuit 15.

The temperature detection circuit 15 includes a temperature sensor that directly or indirectly detects a temperature of the piezoelectric pump 20. The temperature detection circuit 15 generates a detected voltage corresponding to the temperature of the piezoelectric pump 20, and outputs the generated detected voltage to the voltage control circuit 14A. The temperature detection circuit corresponds to a "temperature detector" of the present disclosure, and the detected voltage corresponds to a "temperature regulation voltage" of the present disclosure.

The voltage control circuit 14A supplies a control voltage for limitation to the voltage regulation circuit 11 on the basis of the voltage corresponding to the current limited by the current limiting circuit 13 and the detected voltage from the temperature detection circuit 15.

With such a configuration, the output voltage (regulated voltage) of the voltage regulation circuit 11 is regulated so that the temperature of the piezoelectric pump 20 does not reach the upper limit value.

Figure 5A:
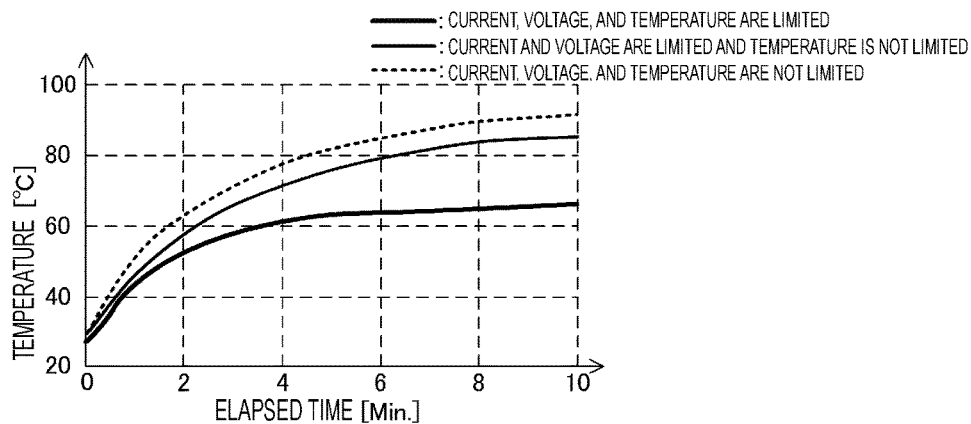
FIG. 5A is a graph showing the temperature change over time when the current, the voltage, and the temperature are limited and when they are not limited.
Figure 5B:
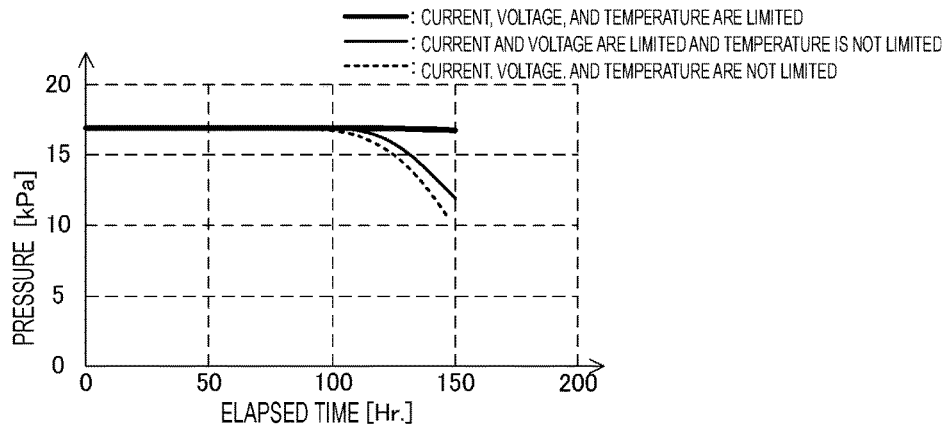
FIG. 5B is a graph showing the change of the discharge pressure of the piezoelectric pump 20 over time when the current, the voltage, and the temperature are limited and when they are not limited.

FIG. 5A is a graph showing the temperature change over time when the current, the voltage, and the temperature are limited and when they are not limited. FIG. 5B is a graph showing the change of the discharge pressure of the piezoelectric pump 20 over time when the current, the voltage, and the temperature are limited, and when they are not limited.

In FIG. 5A, the horizontal axis represents the elapsed time (minutes), and the vertical axis represents the temperature. In FIG. 5B, the horizontal axis represents the elapsed time (hours), and the vertical axis represents the pressure (discharge pressure). In FIGS. 5A and 5B, the thick solid line indicates a case where the current, the voltage, and the temperature are limited, the thin solid line indicates a case where the current and the voltage are limited and the temperature is not limited, and the broken line indicates a case where the current, the voltage, and the temperature are not limited.

As shown in FIG. 5A, by limiting the current, the voltage, and the temperature, an unnecessary increase in temperature of the piezoelectric pump 20 can be suppressed compared with the case where the current, the voltage, and the temperature are not limited. Accordingly, as shown in FIG. 5B, by limiting the current, the voltage, and the temperature, the start time of a decrease in discharge pressure of the piezoelectric pump 20 can be delayed compared with the case where the current, the voltage, and the temperature are not limited. That is, by limiting the current, the voltage, and the temperature, the discharge pressure of the piezoelectric pump 20 can be maintained longer compared with the case where the current, the voltage, and the temperature are not limited.

Also, as shown in FIG. 5A, by limiting the current, the voltage, and the temperature, an unnecessary increase in temperature of the piezoelectric pump 20 is suppressed and the discharge pressure of the piezoelectric pump 20 can be maintained longer compared with the case where the current and the voltage are limited, and the temperature is not limited. That is, performance of the piezoelectric pump 20 is reduced at high temperatures, but by suppressing an unnecessary increase in temperature, a reduction in performance of the piezoelectric pump 20 can be suppressed.

As shown in FIG. 5A, even in the case where the current, the voltage are limited, and the temperature is not limited, an unnecessary increase in temperature of the piezoelectric pump 20 is suppressed and the discharge pressure of the piezoelectric pump 20 can be maintained longer compared with the case where the current, the voltage, and the temperature are not limited.

Figure 6:
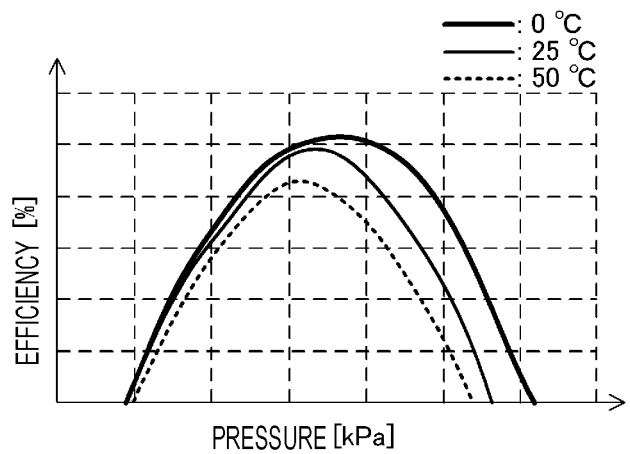
FIG. 6 is a graph showing the relationship between the efficiency of the piezoelectric pump 20 and the temperature of the piezoelectric pump 20.

In addition, the efficiency of the piezoelectric pump 20 can be improved by limiting the current, the voltage, and the temperature. FIG. 6 is a graph showing the relationship between the efficiency of the piezoelectric pump 20 and the temperature of the piezoelectric pump 20. In FIG. 6, the horizontal axis represents the discharge pressure of the piezoelectric pump 20, and the vertical axis represents the efficiency. In FIG. 6, the thick solid line indicates a case where the temperature of the piezoelectric pump 20 is 0° C., the thin solid line indicates a case where the temperature of the piezoelectric pump 20 is 25° C., and the broken line indicates a case where the temperature of the piezoelectric pump 20 is 50° C.

As shown in FIG. 6, regardless of the discharge pressure of the piezoelectric pump 20, the lower the temperature of the piezoelectric pump 20, the higher the efficiency. Therefore, by limiting the current, the voltage, and the temperature, the efficiency of the piezoelectric pump 20 can be improved.

Although it is not easy to directly detect a temperature of the piezoelectric pump 20, the temperature of the piezoelectric pump 20 can be indirectly detected by implementing circuit elements constituting each functional block by mountable components or the like, mounting the circuit elements on a circuit board, and measuring the temperature of the current limiting circuit 13. In such a case, the temperature sensor element of the temperature detection circuit 15 can be disposed close to the current limiting circuit 13. More specifically, the temperature sensor element can be disposed at a position closer to the current limiting circuit 13 than other circuits configuring the driving device 10A. Thereby, temperature detection sensitivity of the temperature sensor element to the current limiting circuit 13 is improved, and the temperature sensor element can measure a temperature of the current limiting circuit 13 more accurately.

Figure 7:
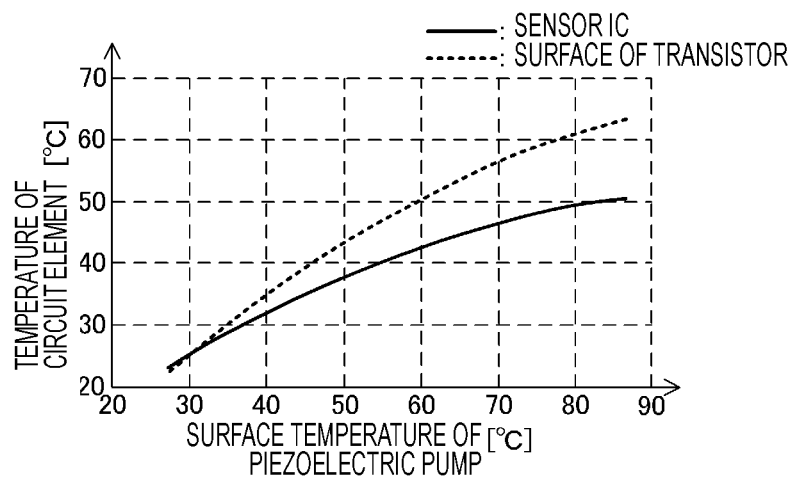
FIG. 7 is a graph showing the correlation between the surface temperature of the piezoelectric pump 20 and the temperature of the circuit board.

FIG. 7 is a graph showing the correlation between the surface temperature of the piezoelectric pump 20 and the temperatures of the circuit element. In FIG. 7, the horizontal axis represents the surface temperature of the piezoelectric pump 20, and the vertical axis represents the temperature of the circuit element. In FIG. 7, the solid line indicates the temperature of the temperature sensor of the temperature detection circuit 15, and the broken line indicates the surface temperature of the transistor constituting the current limiting circuit 13. The temperature sensor is disposed in the vicinity of the transistor constituting the current limiting circuit 13.

With the configuration using the current limiting circuit 13, as shown in FIG. 7, the temperature of the transistor and the temperature of the piezoelectric pump 20 have a correlation. Further, as shown in FIG. 7, as with the temperature of the transistor, the temperature of the temperature sensor has a correlation with the temperature of the piezoelectric pump 20.

Therefore, the temperature of the piezoelectric pump 20, the temperature of the transistor constituting the current limiting circuit 13, and the temperature of the temperature sensor of the temperature detection circuit 15 have a correlation. Thereby, the temperature of the piezoelectric pump 20 can be indirectly detected by detecting the temperature of the transistor of the current limiting circuit 13 by using the temperature sensor. In other words, the temperature of the piezoelectric pump 20 can be indirectly detected by disposing the temperature sensor on the transistor of the current limiting circuit 13 such that such a correlation is sufficiently obtained.

Figure 8:
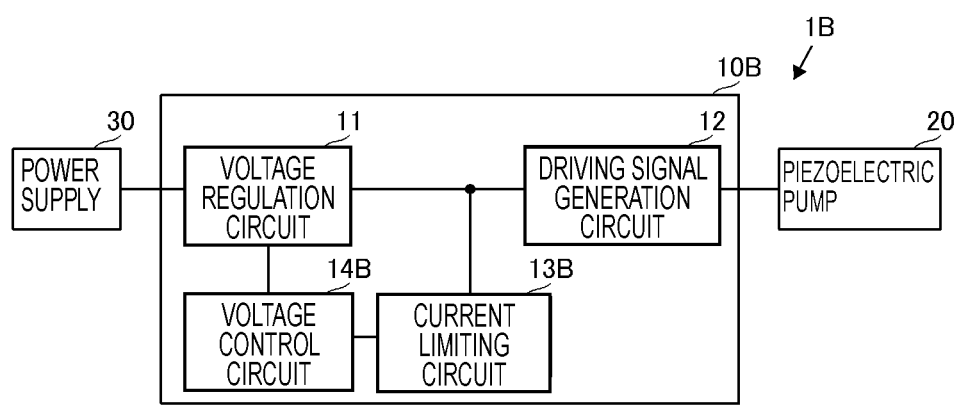
FIG. 8 is a functional block diagram of a fluid control device 1B including a driving device 10B according to Embodiment 3 of the present disclosure.

Next, a driving device according to Embodiment 3 of the present disclosure will be described with reference to the drawings. FIG. 8 is a functional block diagram of a fluid control device 1B including a driving device 10B according to Embodiment 3 of the present disclosure.

As illustrated in FIG. 8, the driving device 10B according to Embodiment 3 is different from the driving device 10 according to Embodiment 1 in that a current limiting circuit 13B and a voltage control circuit 14B are included. The other configurations of the driving device 10B is the same as those of the driving device 10, and a description of the same portions will be omitted.

As illustrated in FIG. 8, the fluid control device 1B includes the driving device 10B, the piezoelectric pump 20, and the power supply 30. The fluid control device 1B is different from the fluid control device 1 according to Embodiment 1 in that the driving device 10B is included, and other basic configurations are the same as those of the fluid control device 1.

The driving device 10B includes the voltage regulation circuit 11, the driving signal generation circuit 12, the current limiting circuit 13B, and the voltage control circuit 14B.

The current limiting circuit 13B is connected to the terminal, in which the regulated voltage is input, in the driving signal generation circuit 12. As will be described later, the voltage control circuit 14B is constituted by a resistor element.

Figure 9:
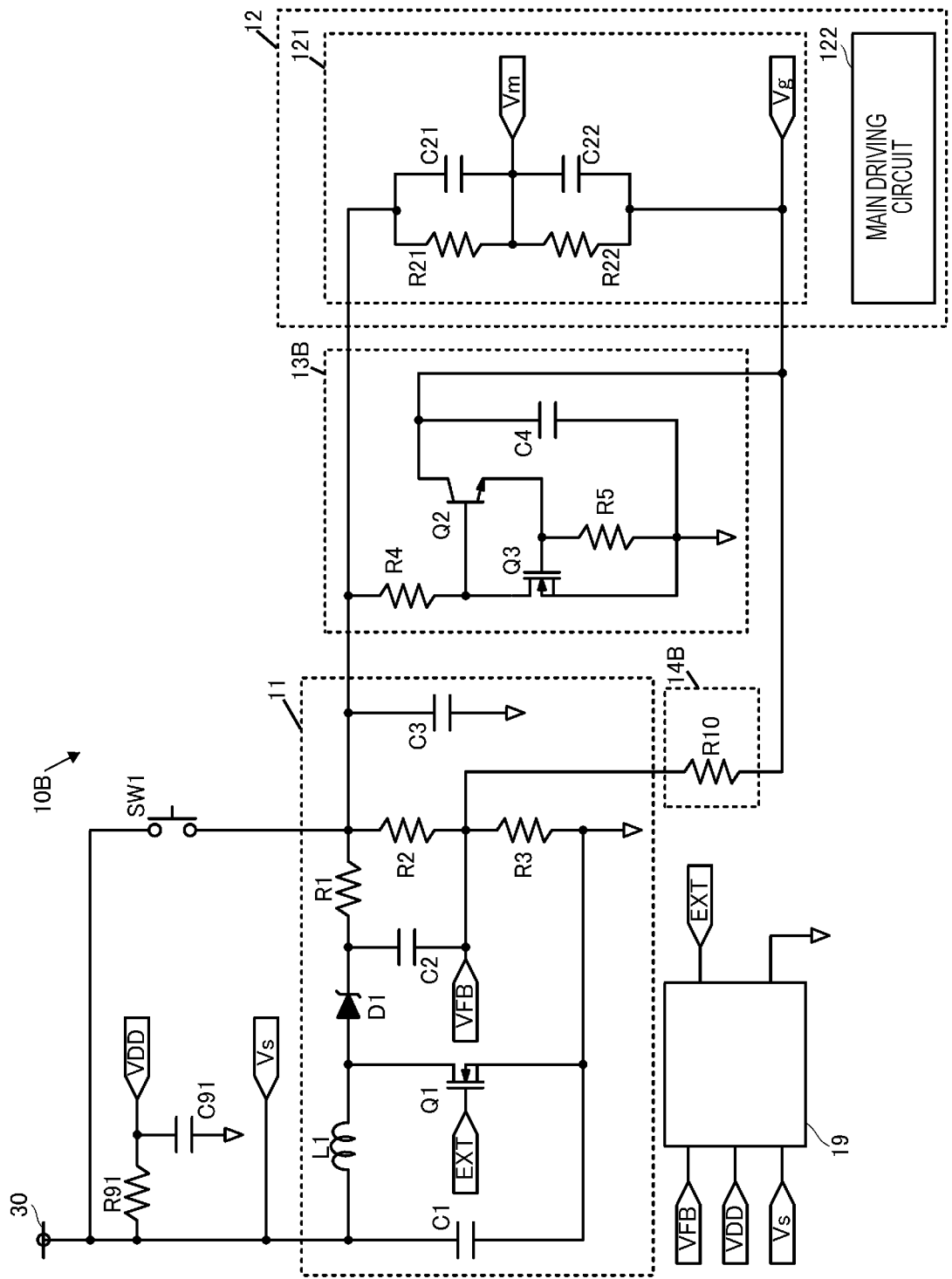
FIG. 9 is a circuit diagram illustrating an example of the driving device 10B according to Embodiment 3 of the present disclosure.
Figure 10:
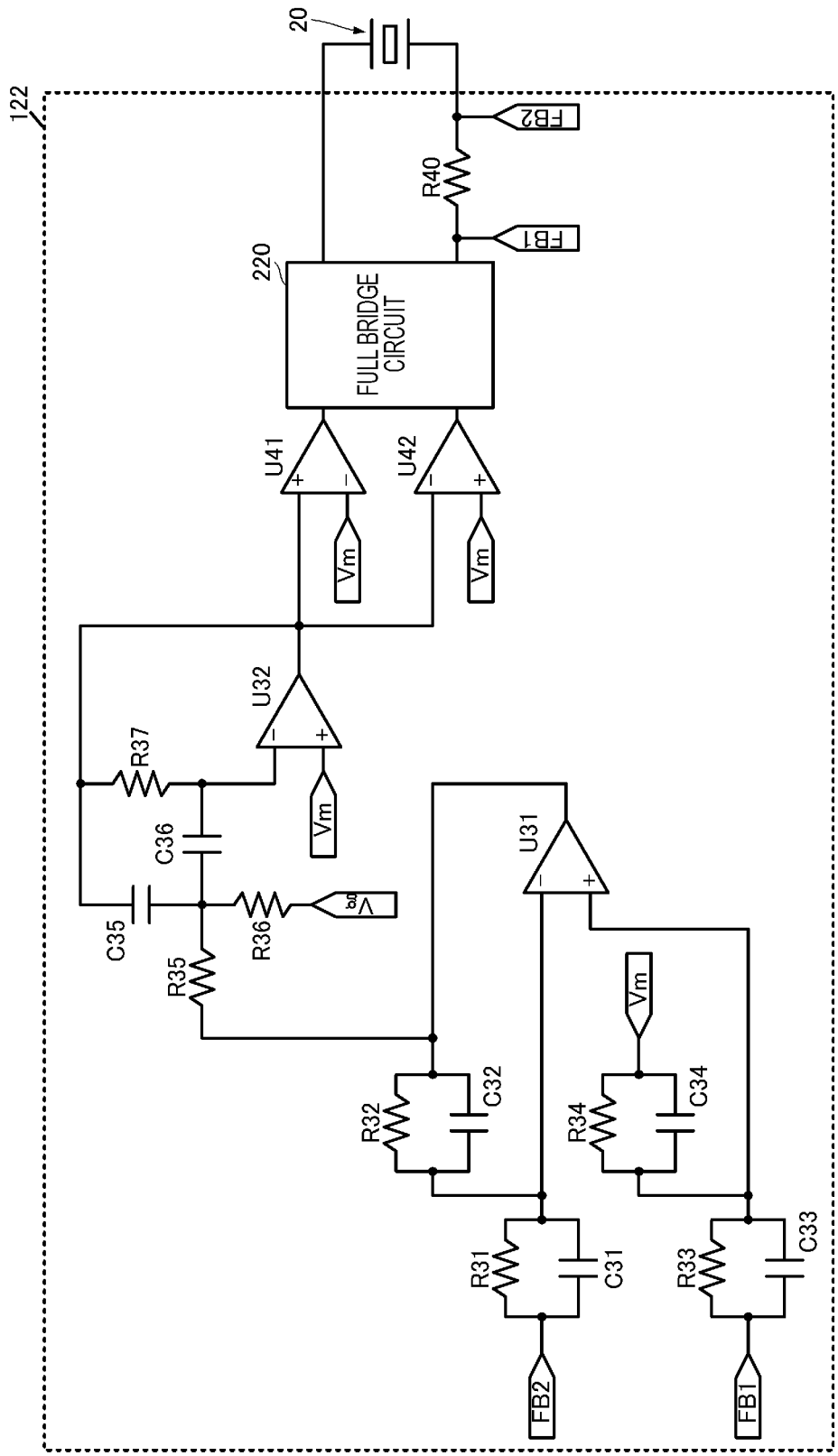
FIG. 10 is a circuit diagram illustrating an example of a main driving circuit of the driving signal generation circuit 12 in the driving device 10B according to Embodiment 3 of the present disclosure.

Such a driving device 10B is realized by, for example, an analog circuit illustrated in FIGS. 9 and 10. FIG. 9 is a circuit diagram illustrating an example of the driving device according to Embodiment 3 of the present disclosure. Note that FIG. 9 illustrates a case where a step-up circuit is used as the voltage regulation circuit 11.

As illustrated in FIG. 9, the driving device 10B includes the voltage regulation circuit 11, the driving signal generation circuit 12, the current limiting circuit 13B, the voltage control circuit 14B, and a control voltage generation IC 19. The driving signal generation circuit 12 includes a pre-stage circuit 121 and a main driving circuit 122.

The voltage regulation circuit 11 includes a semiconductor element Q1, a diode D1, a capacitor C1, a capacitor C2, a capacitor C3, an inductor L1, a resistor element R1, a resistor element R2, and a resistor element R3. The semiconductor element Q1 is constituted by a field effect transistor (FET).

One end of the capacitor C1 is connected to the power supply 30, and the other end of the capacitor C1 is connected to a reference potential.

One end of the inductor L1 is connected to the one end of the capacitor C1, and the other end of the inductor L1 is connected to a drain of the semiconductor element Q1. A source of the semiconductor element Q1 is connected to the reference potential (the other end of the capacitor C1). A switch control voltage from the control voltage generation IC 19 is applied to a gate of the semiconductor element Q1.

An anode of the diode D1 is connected to the other end of the inductor L1 (the drain of the semiconductor element Q1), and a cathode of the diode D1 is connected to one end of the resistor element R1 and one end of the capacitor C2.

The other end of the resistor element R1 is connected to one end of the resistor element R2 and serves as an output terminal of the voltage regulation circuit 11. The other end of the resistor element R2 is connected to one end of the resistor element R3, and the other end of the resistor element R3 is connected to the reference potential. Further, the other end of the capacitor C2 is connected to the other end of the resistor element R2. This node is connected to a terminal for step-up feedback of the control voltage generation IC 19 (an application terminal of the step-up feedback voltage VFB).

One end of the capacitor C3 is connected to the output terminal (the other end of the resistor element R1) of the voltage regulation circuit 11, and the other end thereof is connected to the reference potential.

With such a circuit configuration, a step-up chopper circuit is realized.

Note that one end of a resistor element R91 is connected to the power supply 30, and the other end of the resistor element R91 is connected to a VDD terminal of the control voltage generation IC 19. Thereby, power is supplied to the control voltage generation IC 19. One end of the capacitor C91 is connected to the other end of the resistor element R91, and the other end of the capacitor C91 is connected to the reference potential. Note that the circuit constituted by the resistor element R91 and the capacitor element C91 is a low pass filter for noise removal, and can be omitted. Further, a Vs terminal of the control voltage generation IC 19 is connected to the power supply 30.

Note that a switch element SW1 is connected between the power supply 30 and the other end of the resistor element R1. When the switch element SW1 is open, the voltage regulation circuit 11 operates, and when the switch element SW1 is short-circuited, the voltage regulation circuit 11 does not operate. The switch element SW1 can be omitted as long as the voltage of the power supply 30 is lower than a desired voltage for driving the piezoelectric pump 20 and the circuit configuration is required to be stepped-up.

The current limiting circuit 13B includes a semiconductor element Q2, a semiconductor element Q3, a capacitor C4, a resistor element R4, and a resistor element R5. Although the semiconductor element Q2 is a transistor and the semiconductor element Q3 is an FET, these may be transistors or FETs.

One end of the resistor element R4 corresponds to an input terminal and an output terminal of the current limiting circuit 13B, and is connected to the output terminal of the voltage regulation circuit 11, that is, the other end of the resistor element R1. Further, the one end of the resistor element R4 is connected to an input terminal of the driving signal generation circuit 12.

A base of the semiconductor element Q2 is connected to the other end of the resistor element R4. An emitter of the semiconductor element Q2 is connected to a gate of the semiconductor element Q3, and a collector is connected to the reference potential via the capacitor C4.

A drain of the semiconductor element Q3 is connected to a gate of the semiconductor element Q2. A source of the semiconductor element Q3 is connected to the reference potential.

The emitter of the semiconductor element Q2 and the gate of the semiconductor element Q3 are connected to the reference potential via the resistor element R5.

With such a configuration, a current limiting circuit that limits a current flowing between the input terminal and the output terminal on the one end side of the resistor element R4 is realized.

The voltage control circuit 14B is configure by a resistor element R10. One end of the resistor element R10 is connected to the collector of the semiconductor element Q2 of the current limiting circuit 13B. The other end of the resistor element R10 is connected to a node between the resistor element R2 and the resistor element R3 in the voltage regulation circuit 11.

With such a circuit configuration, when an input current of the driving signal generation circuit 12 increases, the input current is limited by the current limiting circuit 13B. Accordingly, an emitter voltage of the semiconductor element Q2 of the current limiting circuit 13B increases.

As the emitter voltage increases, a voltage on the one end side of the resistor element R10 of the voltage control circuit 14B increases, and a potential on the other end side (control voltage for limitation) also increases.

Here, assuming that the output voltage (stepped-up voltage) of the voltage regulation circuit 11 is Vc, the feedback voltage for step-up is VFB, the voltage on the one end side of the resistor R10 of the voltage control circuit 14B is Vg, and the resistance value of the resistor element R2 is R2, the resistance value of the resistor element R3 is R3, and the resistance value of the resistor element R10 is R10, Vc is expressed by the following equation.

$$Vc=(R2/R10)\times(VFB-Vg)+((R2/R3)+1)\times VFB \quad \text{(Equation 1)}$$

Equation 1 shows that Vc decreases as Vg increases.

That is, the output voltage (stepped-up voltage) of the voltage regulation circuit 11 decreases according to the increase in voltage by limiting the current. Thereby, the input voltage of the driving signal generation circuit 12 can be suppressed, and the above-described current limitation and voltage limitation to the piezoelectric pump 20 can be realized.

Note that the driving signal generation circuit 12 is realized by, for example, the circuits illustrated in FIGS. 9 and 10. FIG. 10 is a circuit diagram illustrating an example of the main driving circuit of the driving signal generation circuit in the driving device according to Embodiment 3 of the present disclosure.

As described above, the driving signal generation circuit 12 includes the pre-stage circuit 121 and the main driving circuit 122.

As illustrated in FIG. 9, the pre-stage circuit 121 includes a capacitor C21, a capacitor C22, a resistor element R21, and a resistor element R22.

The resistor element R21 and the resistor element R22 are connected in series to each other. Specifically, another end of the resistor element R21 and one end of the resistor element R22 are connected to each other. One end of the resistor element R21 is an input terminal on the Hi side of the pre-stage circuit 121 and is connected to the one end of the resistor element R4 of the current limiting circuit 13B. The other end of the resistor element R22 is connected to the one end of the resistor element R10 of the voltage control circuit 14B.

The capacitor C21 is connected in parallel to the resistor element R21, and the capacitor C22 is connected in parallel to the resistor element R22.

A node between the resistor element R21 and the resistor element R22 (a point of the intermediate potential Vm) and the other end side of the resistor element R22 (a point of the potential Vg) are connected to the main driving circuit 122.

As illustrated in FIG. 10, the main driving circuit 122 includes an operational amplifier U31, an operational amplifier U32, an operational amplifier U41, an operational amplifier U42, a full bridge circuit 220, a capacitor C31, a capacitor C32, a capacitor C33, a capacitor C34, a capacitor C35, a capacitor C36, a resistor element R31, a resistor element R32, a resistor element R33, a resistor element R34, a resistor element R35, a resistor element R36, a resistor element R37, and a resistor element R40.

The resistor element R31 and the capacitor C31 are connected in parallel to each other. The resistor element R32 and the capacitor C32 are connected in parallel to each other. The resistor element R33 and the capacitor C33 are connected in parallel to each other. The resistor element R34 and the capacitor C34 are connected in parallel to each other.

One end of a parallel circuit of the resistor element R31 and the capacitor C31 is connected to an inverting input terminal of the operational amplifier U31. The other end of the parallel circuit of the resistor element R31 and the capacitor C31 is connected to one end of the resistor element R40 for detecting the current of the piezoelectric pump 20.

One end of a parallel circuit of the resistor element R33 and the capacitor C33 is connected to a non-inverting input terminal of the operational amplifier U31. The other end of the parallel circuit of the resistor element R33 and the capacitor C33 is connected to the other end of the resistor element R40 for detecting the current of the piezoelectric pump 20. Further, the non-inverting input terminal of the operational amplifier U31 is connected to the point of the intermediate potential Vm of the pre-stage circuit 121 via a parallel circuit of the resistor element R34 and the capacitor C34.

A parallel circuit of the resistor element R32 and the capacitor C32 is connected between an output terminal and the inverting input terminal of the operational amplifier U31.

The output terminal of the operational amplifier U31 is connected to an inverting input terminal of the operational amplifier U32 via the resistor element R35 and the capacitor C36. A node between the resistor element R35 and the capacitor C36 is connected to the point of the potential Vg via the resistor element R36. Further, the node between the resistor element R35 and the capacitor C36 is connected to one end of the capacitor C35, and the other end of the capacitor C35 is connected to one end of the resistor element R37. The other end of the resistor element R37 is connected to the capacitor C36 on the inverting input terminal side of the operational amplifier U32.

A non-inverting input terminal of the operational amplifier U32 is connected to the point of the intermediate potential Vm. An output terminal of the operational amplifier U32 is connected to a non-inverting input terminal of the operational amplifier U41 and an inverting input terminal of the operational amplifier U42, and also connected to the one end of the resistor element R37.

An inverting input terminal of the operational amplifier U41 and a non-inverting input terminal of the operational amplifier U42 are connected to the point of the intermediate potential Vm. An output terminal of the operational amplifier U41 and an output terminal of the operational amplifier U42 are connected to the full bridge circuit 220.

The full bridge circuit 220 has a circuit configuration using four known semiconductor elements. A first input terminal of the full bridge circuit 220 is connected to the output terminal of the operational amplifier U41, and a second input terminal of the full bridge circuit 220 is connected to the output terminal of the operational amplifier U42. A series circuit of the piezoelectric pump 20 and the resistor element R40 is connected between a first output terminal and a second output terminal of the full bridge circuit 220.

With this configuration, the self-excited driving signal generation circuit 12 is realized. In such a case, a resonance frequency of the driving signal generated by the driving signal generation circuit 12 is a frequency corresponding to circuit constants of the piezoelectric pump 20 and respective circuit elements constituting the driving signal generation circuit 12. That is, it is possible to drive the piezoelectric pump 20 at a desired driving frequency by appropriately setting the circuit constants of the respective circuit elements constituting the driving signal generation circuit 12.

As described above, by using the circuit configurations illustrated in FIGS. 9 and 10, the driving device 10B can be realized by the analog circuit.

Further, in the configuration illustrated in FIG. 9, by constituting the voltage control circuit 14B with the resistor element R10, it is possible to suppress undesired oscillation of the circuits including the voltage regulation circuit 11 and the driving signal generation circuit 12. Accordingly, it is possible to suppress an undesired shift of the resonance frequency of the driving signal generation circuit 12.

Further, in the configuration illustrated in FIG. 9, since the capacitor C4 is included in the current limiting circuit 13B, even when a noise with a frequency component of the driving signal is superimposed on a collector voltage of the semiconductor element Q2, unnecessary oscillation due to the noise can be suppressed.

Figure 11:
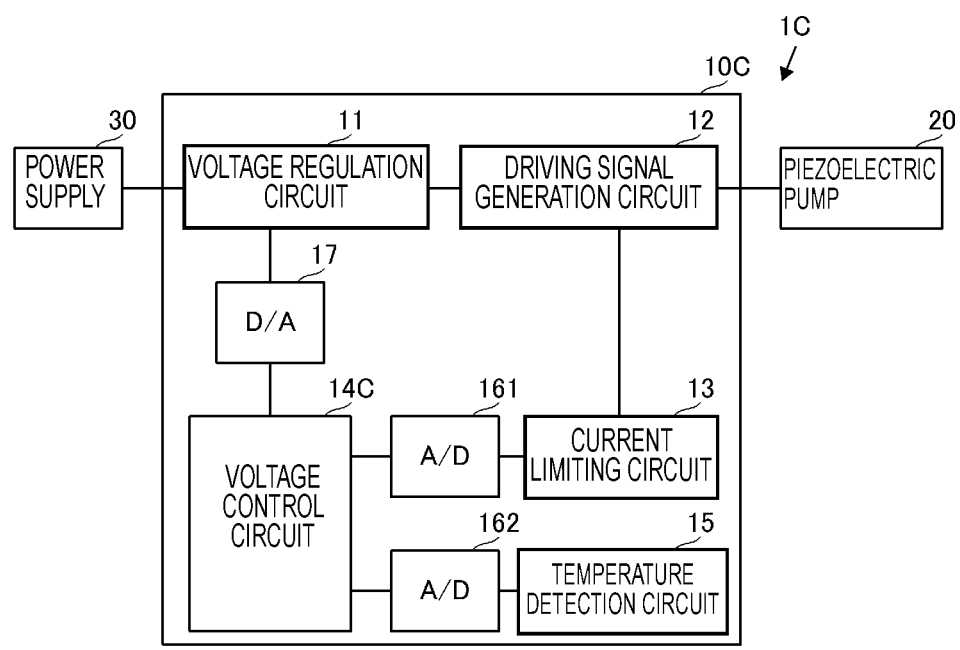
FIG. 11 is a functional block diagram of a fluid control device 1C including a driving device 10C according to Embodiment 4 of the present disclosure.

Next, a driving device according to Embodiment 4 of the present disclosure will be described with reference to the drawings. FIG. 11 is a functional block diagram of a fluid control device 1C including a driving device 10C according to Embodiment 4 of the present disclosure.

As illustrated in FIG. 11, the driving device 10C according to Embodiment 4 is different from the driving device 10A according to Embodiment 2 in that a voltage control circuit 14C, an A/D converter 161, an A/D converter 162, and a D/A converter 17 are included. The other configurations of the driving device 10C is the same as those of the driving device 10A, and a description of the same portions will be omitted.

The voltage control circuit 14C is realized by a digital IC, such as a micro control unit (MCU).

The A/D converter 161 and the A/D converter 162 are circuits for converting an analog signal to a digital signal, and the D/A converter 17 is a circuit for converting a digital signal to an analog signal.

The current limiting circuit 13 outputs a voltage corresponding to a limited current to the voltage control circuit 14C via the A/D converter 161. The temperature detection circuit 15 outputs a detected voltage corresponding to a temperature of the piezoelectric pump 20 to the voltage control circuit 14C via the A/D converter 162.

The voltage control circuit 14C generates a control voltage for limitation to the voltage regulation circuit 11 on the basis of a voltage corresponding to the limited current from the current limiting circuit 13 and the detected voltage from the temperature detection circuit 15. The voltage control circuit 14C outputs a control voltage for limitation to the voltage regulation circuit 11 via the D/A converter 17.

Thereby, the output voltage (regulated voltage) from the voltage regulation circuit 11 is limited.

As described above, even when the voltage control circuit 14C is a digital circuit, limitation of the current, limitation of the voltage, and limitation of the temperature to the piezoelectric pump 20 can be realized similarly to the above-described driving device 10A.

Note that, with this configuration, the temperature detection circuit 15 and the A/D converter 162 may be omitted. In this case, the voltage control circuit 14 of the driving device 10 according to Embodiment 1 is replaced with the voltage control circuit 14C of a digital circuit.

Figure 12:
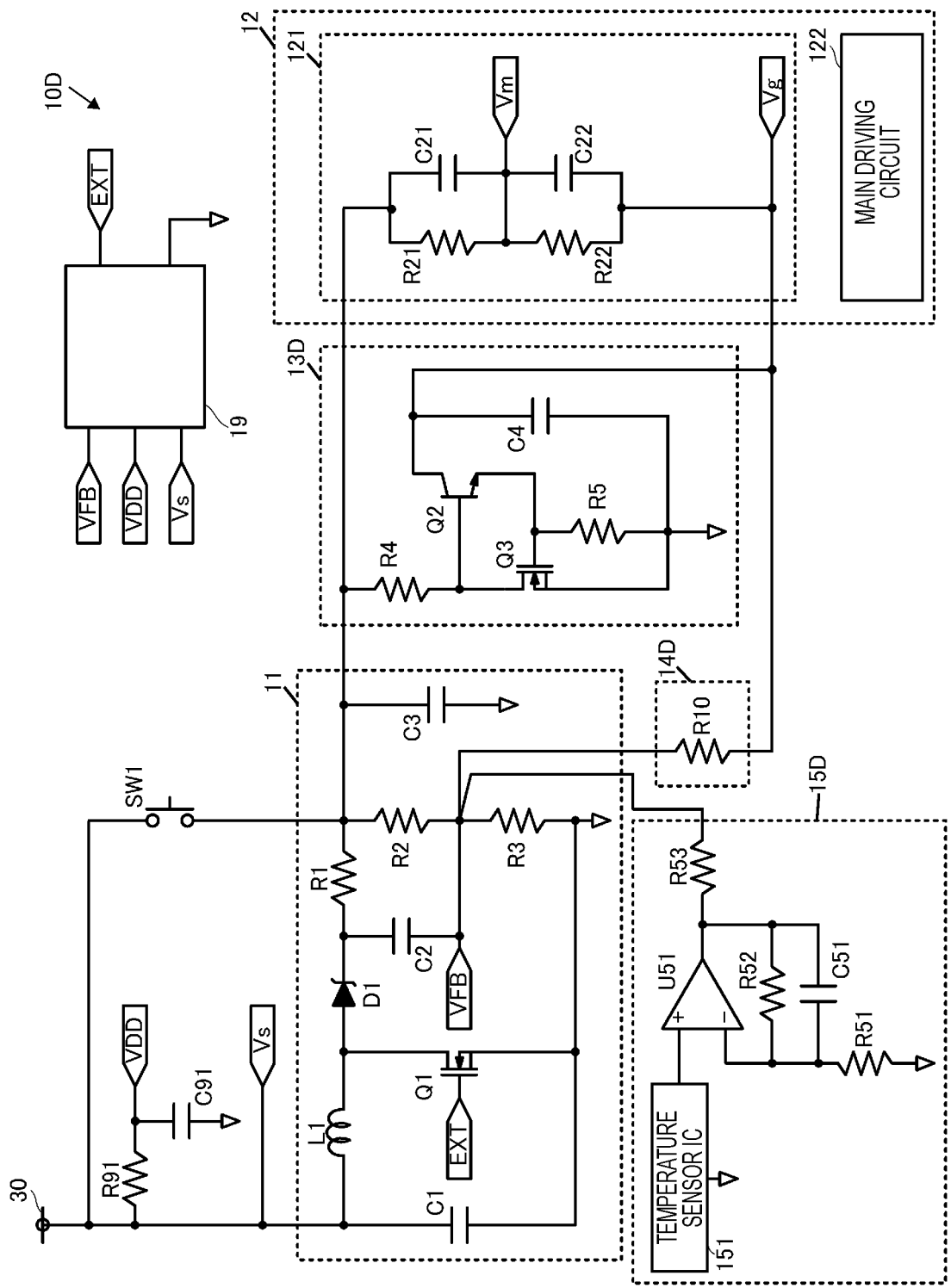
FIG. 12 is a circuit diagram illustrating an example of a driving device 10D according to Embodiment 5 of the present disclosure.

Next, a driving device according to Embodiment 5 of the present disclosure will be described with reference to the drawings. FIG. 12 is a circuit diagram illustrating an example of a driving device 10D according to Embodiment 5 of the present disclosure.

The driving device 10D is realized by, for example, the analog circuit illustrated in FIGS. 12 and 10.

As illustrated in FIG. 12, the driving device 10D is obtained by adding a circuit configuration of a temperature detection circuit 15D to the driving device 10B illustrated in FIG. 9. A current limiting circuit 13D in FIG. 12 is the same as the current limiting circuit 13B in FIG. 9, and a voltage control circuit 14D in FIG. 12 is the same as the voltage control circuit 14B in FIG. 9. The other circuit configurations of the driving device 10D is the same as those of the driving device 10B, and a description of the same portions will be omitted.

The temperature detection circuit 15D includes a temperature sensor IC 151, an operational amplifier U51, a capacitor C51, a resistor element R51, a resistor element R52, and a resistor element R53.

A non-inverting input terminal of the operational amplifier U51 is connected to the temperature sensor IC 151. An inverting input terminal of the operational amplifier U51 is connected to the reference potential via the resistor element R51. An output terminal of the operational amplifier U51 is connected to the inverting input terminal of the operational amplifier U51 via a parallel circuit of the resistor element R52 and the capacitor C51. The output terminal of the operational amplifier U51 is connected to the node between the resistor element R2 and the resistor element R3 in the voltage regulation circuit 11 via the resistor element R53.

With this configuration, a signal including a detected voltage corresponding to a temperature of the piezoelectric pump 20 outputted from the temperature sensor IC 151 is smoothed, and is applied to the node between the resistor element R2 and the resistor element R3 in the voltage regulation circuit 11.

In this case, an output voltage (stepped-up voltage) Vc of the voltage regulation circuit 11 is limited (regulated) on the basis of the following (Equation 2). In the following (Equation 2), Vt represents the output voltage (detected voltage) of the temperature detection circuit 15D, and R53 represents the resistance value of the resistor element R53.

$$Vc=(R2/R10)\times(VFB-Vg)+(R2/R53)\times(VFB-Vt)+((R2/R3)+1)\times VFB \quad \text{(Equation 2)}$$

Even in such a configuration, similarly to the above-described embodiments, it is possible to realize limitation of the current, limitation of the voltage, and limitation of the temperature to the piezoelectric pump 20, and it is possible to obtain the same effects as those of the above-described embodiments.

Further, with this configuration, since a detected voltage of the temperature sensor IC 151 is smoothed, noise included in the detected voltage is suppressed, and more stable limitation of a temperature can be realized.

Figure 13:
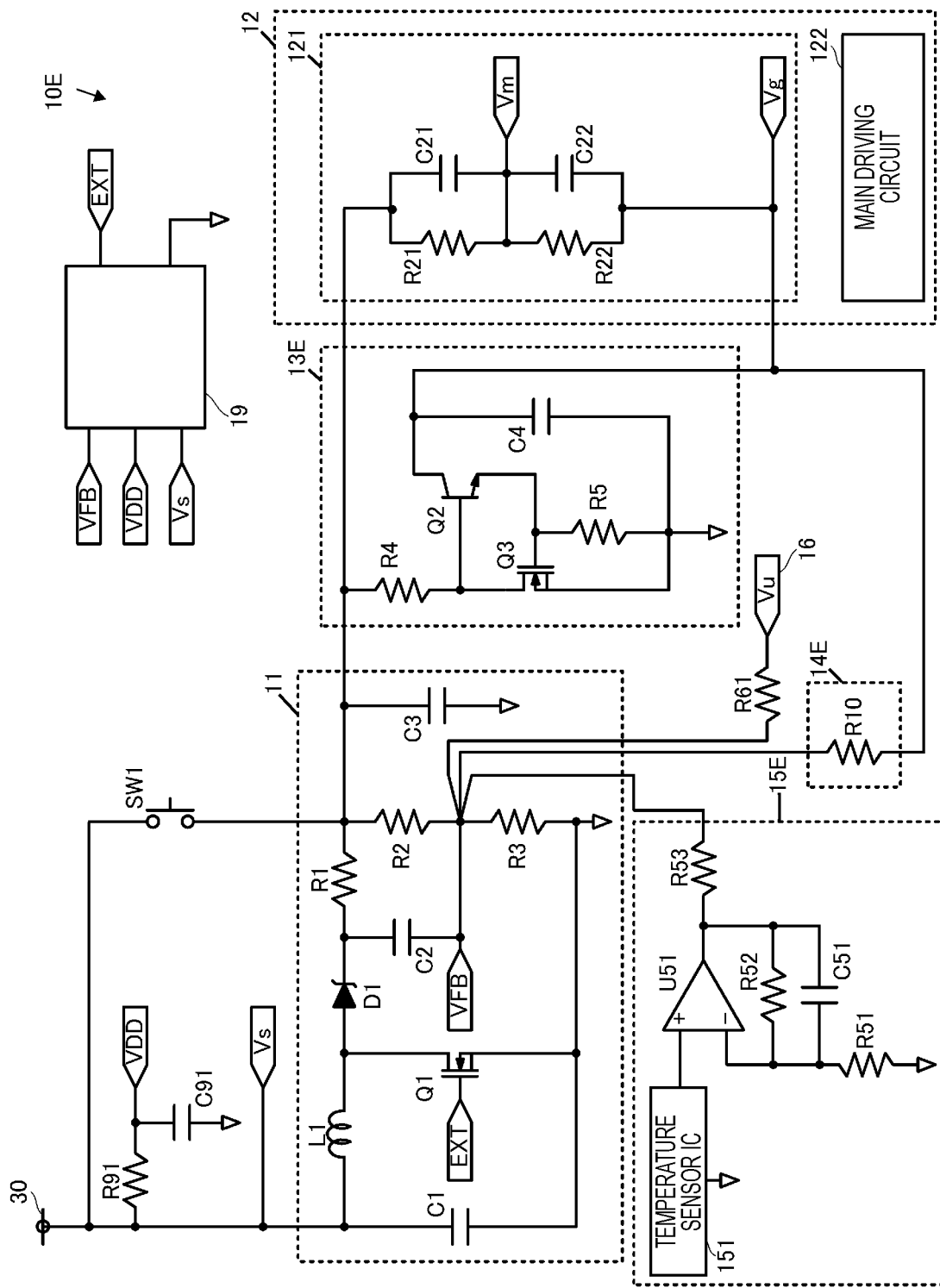
FIG. 13 is a circuit diagram illustrating an example of a driving device 10E according to Embodiment 6 of the present disclosure.

Next, a driving device according to Embodiment 6 of the present disclosure will be described with reference to the drawings. FIG. 13 is a circuit diagram illustrating an example of a driving device 10E according to Embodiment 6 of the present disclosure.

The driving device 10E is realized by, for example, the analog circuit illustrated in FIGS. 13 and 10.

As illustrated in FIG. 13, the driving device 10E is obtained by adding an external input terminal 16 to the driving device 10D illustrated in FIG. 12. A current limiting circuit 13E in FIG. 13 is the same as the current limiting circuit 13D in FIG. 12, and a voltage control circuit 14E in FIG. 13 is the same as the voltage control circuit 14D in FIG. 12. The other circuit configurations of the driving device 10E is the same as those of the driving device 10D, and a description of the same portions will be omitted.

The external input terminal 16 is connected to the node between the resistor element R2 and the resistor element R3 in the voltage regulation circuit 11 via a resistor element R61. An external control voltage Vu received from the external input terminal 16 is applied to the node between the resistor element R2 and the resistor element R3 in the voltage regulation circuit 11 via the resistor element R61.

In this case, an output voltage (stepped-up voltage) Vc of the voltage regulation circuit 11 is limited (regulated) on the basis of the following (Equation 3). In the following (Equation 3), Vu represents the external control voltage, and R60 represents the resistance value of the resistor element R61.

$$Vc=(R2/R10)\times(VFB-Vg)+(R2/R53)\times(VFB-Vt)+(R2/R60)\times(VFB-Vu)+((R2/R3)+1)\times VFB \quad \text{(Equation 3)}$$

Even in such a configuration, similarly to the above-described embodiments, it is possible to realize limitation of the current, limitation of the voltage, and limitation of the temperature to the piezoelectric pump 20, and it is possible to obtain the same effects as those of the above-described embodiments.

Further, with this configuration, a stepped-up voltage can be appropriately regulated by the external control voltage Vu.

Note that the above-described voltage regulation circuit is not limited to the step-up chopper circuit, and may use a step-up circuit, such as a synchronous rectification system, a charge pump system, a linear regulator system, or the like, any of various step-down circuits, or any of various step-up/down circuits.

In addition, in the above description, the aspects in which the circuit elements of each of functional blocks constituting the driving device are mounted on a circuit board is described, but the voltage regulation circuit, the driving signal generation circuit, the current limiting circuit, and the voltage control circuit can be mounted on a single circuit board. Thereby, the driving device can be reduced in size and can be manufactured at low cost.

REFERENCE SIGNS LIST 1, 1A, 1B, 1C FLUID CONTROL DEVICE
10, 10A, 10B, 10C, 10D, 10E DRIVING DEVICE
11 VOLTAGE REGULATION CIRCUIT
12 DRIVING SIGNAL GENERATION CIRCUIT
13, 13B, 13D, 13E CURRENT LIMITING CIRCUIT
14, 14A, 14B, 14C, 14D, 14E VOLTAGE CONTROL CIRCUIT
15, 15D TEMPERATURE DETECTION CIRCUIT
16 EXTERNAL INPUT TERMINAL
17 D/A CONVERTER
19 CONTROL VOLTAGE GENERATION IC
20 PIEZOELECTRIC PUMP
30 POWER SUPPLY
121 PRE-STAGE CIRCUIT
122 MAIN DRIVING CIRCUIT
151 TEMPERATURE SENSOR IC
161, 162 A/D CONVERTER
220: FULL BRIDGE CIRCUIT
C1, C2, C21, C22, C3, C31, C32, C33, C34, C35, C36, C4, C51, C91 CAPACITOR
D1 DIODE
L1 INDUCTOR
Q1, Q2, Q3 SEMICONDUCTOR ELEMENT
R1, R10, R2, R21, R22, R3, R31, R32, R33, R34, R35, R36, R37, R4, R40, R5, R51, R52, R53, R60, R61, R91 RESISTOR ELEMENT
SW1 SWITCH ELEMENT
U31, U32, U41, U42, U51 OPERATIONAL AMPLIFIER
SW1 SWITCH ELEMENT

The invention claimed is:

1. A driving device configured to control driving of a piezoelectric element, the driving device comprising:
a voltage regulation circuit configured to output a driving voltage;
a driving signal generation circuit configured to receive the driving voltage outputted from the voltage regulation circuit, and to generate a driving signal supplied to the piezoelectric element based on the driving voltage;
a current limiting circuit configured to receive a driving current corresponding to the driving voltage outputted from the driving signal generation circuit, to limit the driving current to be equal to or lesser than a specified current, and to generate a current control voltage based on a level of the driving current relative to the specified current; and
a voltage control circuit configured to receive the current control voltage outputted from the current limiting circuit, and to output a control signal to the voltage regulation circuit based on the current control voltage, the control signal being configured to control a level of the driving voltage.

2. The driving device according to claim 1, further comprising:
a temperature detector configured to detect a temperature of the piezoelectric element, and to generate a temperature regulation voltage,
wherein the voltage control circuit is configured to output the control signal based on the current control voltage and the temperature regulation voltage.

3. The driving device according to claim 1, wherein the voltage regulation circuit, the driving signal generation circuit, the current limiting circuit, and the voltage control circuit are mounted on a circuit board.

4. The driving device according to claim 3, further comprising:
a temperature detector configured to detect a temperature of the piezoelectric element, and to generate a temperature regulation voltage, the control signal being further based on the temperature regulation voltage, wherein:
the temperature detector comprises a temperature sensor mounted on the circuit board.

5. The driving device according to claim 4, wherein the temperature sensor is located on the circuit board at a position closer to the current limiting circuit than the voltage regulation circuit, the driving signal generation circuit, and the voltage control circuit.

6. The driving device according to claim 1, wherein the driving signal generation circuit is a self-excited analog circuit.

7. The driving device according to claim 6, wherein the voltage control circuit comprises a resistor connected to the driving signal generation circuit.

8. The driving device according to claim 1, wherein the voltage control circuit is a digital circuit configured to use an output of the current limiting circuit.

9. A fluid control device comprising:
the driving device according to claim 1; and
a piezoelectric pump comprising the piezoelectric element.

* * * * *